United States Patent
Cogdill et al.

(10) Patent No.: US 7,054,179 B2
(45) Date of Patent: May 30, 2006

(54) DOUBLE-HIGH MEMORY SYSTEM COMPATIBLE WITH TERMINATION SCHEMES FOR SINGLE-HIGH MEMORY SYSTEMS

(75) Inventors: Mike Cogdill, Longmont, CO (US); Idis Ramona Martinez, Roseville, CA (US); Derek Steven Schumacher, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 270 days.

(21) Appl. No.: 10/698,709

(22) Filed: Oct. 30, 2003

(65) Prior Publication Data
US 2005/0094425 A1     May 5, 2005

(51) Int. Cl.
*G11C 5/06*     (2006.01)

(52) U.S. Cl. .......................................... 365/63; 365/51
(58) Field of Classification Search ................... 365/51, 365/61, 63
See application file for complete search history.

(56) References Cited

U.S. PATENT DOCUMENTS

| | | | |
|---|---|---|---|
| 6,215,686 B1 * | 4/2001 | Deneroff et al. .............. | 365/52 |
| 6,680,623 B1 * | 1/2004 | Hirai et al. .................... | 326/30 |
| 2005/0068800 A1 * | 3/2005 | Fahmy et al. ................. | 365/63 |

* cited by examiner

*Primary Examiner*—Son T. Dinh

(57) ABSTRACT

A double-high memory system compatible with termination schemes for single-high memory systems. The system includes an interface for input and output of data. A plurality of memory units is configured in two rows. A transmission line couples the plurality of memory units and the interface. The double-high memory system is provided in a non-stacked arrangement.

25 Claims, 6 Drawing Sheets

DOUBLE-HIGH MEMORY SYSTEM COMPATIBLE WITH TERMINATION SCHEMES FOR SINGLE-HIGH MEMORY SYSTEMS

TECHNICAL FIELD

Embodiments of the present invention pertain to a double-high memory system compatible with termination schemes for single-high memory systems.

BACKGROUND ART

Conventional memory systems employ a single DIMM (dual inline memory module) in the space that is designated for the containment of system memory modules. In many of these systems the space designated for the containment of system memory modules have the capacity to hold additional modules. However on-board termination characteristics limit the use of this space to components that adhere to industry standards already in place.

Conventional DRAM topologies are designed to support an industry-standard DDR SDRAM DIMM design. A double-high DIMM is similar to an industry-standard DIMM (see FIG. 1 industry-standard DIMM) except that it has an extra row of DRAM chips that doubles the memory occupying the space conventionally occupied by one DIMM connector. A criterion in the design of double-high DIMMs may be that the underlying memory subsystem function with either an industry-standard DIMM, custom double-high DIMMs or both types of DIMMS. Other than the ability to mix DIMMs in the system, the double-high DIMM can be a fully custom design.

FIG. 1 is a block diagram of a conventional industry-standard DDR SDRAM DIMM circuit topology. FIG. 1 shows DIMM connector 101, resistor 103, DDR SDRAM 105, transmission line 1 and 107 transmission line 2 109. In FIG. 1 transmission line 1 107 couples DIMM connector 101 to a resistor 103 and transmission line 2 109 couples resistor 103 to DDR SDRAM 105.

DIMM connector 101 receives data input and outputs and supplies the data to internal or external circuit elements. Resistor 103 transmits data that is received at the DDR SDRAM 105 when data is to be stored and transmits data to DIMM connector 101 when data is accessed from the DDR SDRAM 105.

Industry-standard DIMMs require certain on-board termination in the memory subsystem outside the confines of the DIMM. This requirement places serious constraints on possible designs of the double-high DIMM. One way to take advantage of the additional space that is available is by employing memory unit (e.g., DRAM etc.) stacking technologies. However, the use of memory unit (e.g., DRAM etc.) stacking technologies is undesirable as the methodologies employed prevent optimal use of board space since DIMMs using memory unit stacking technologies conventionally utilize more board area than non-stacked arrangements because of thermal airflow requirements.

DISCLOSURE OF THE INVENTION

Embodiments of the present invention pertain to a double-high memory system compatible with termination schemes for single-high memory systems. The system includes an interface for input and output of data. A plurality of memory units is configured in two rows. A transmission line couples the plurality of memory units and the interface. The double-high memory module is provided in a non-stacked arrangement.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODE FOR CARRYING OUT THE INVENTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Figure 1:
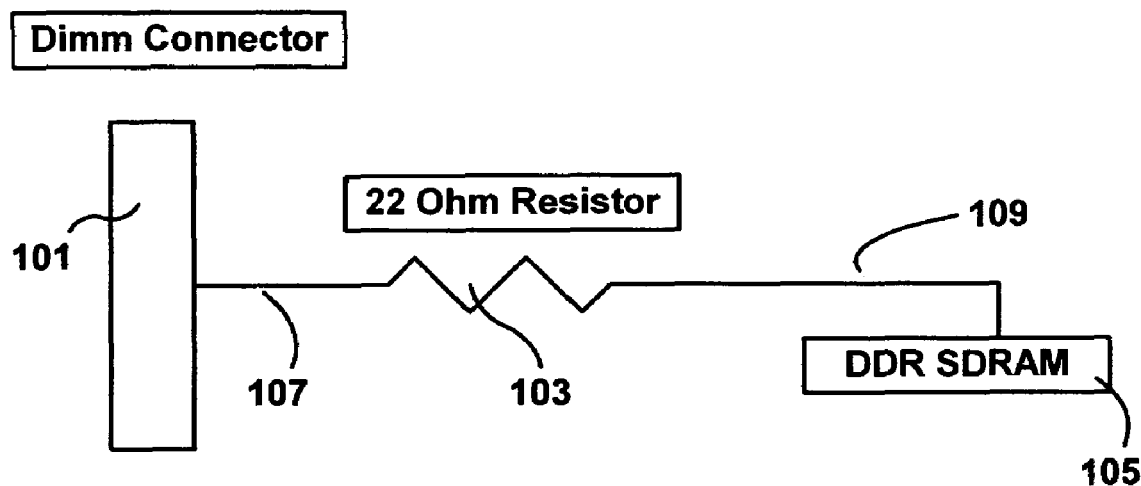
FIG. 1 is a block diagram of a conventional industry-standard DDR SDRAM DIMM circuit topology.
Figure 2:
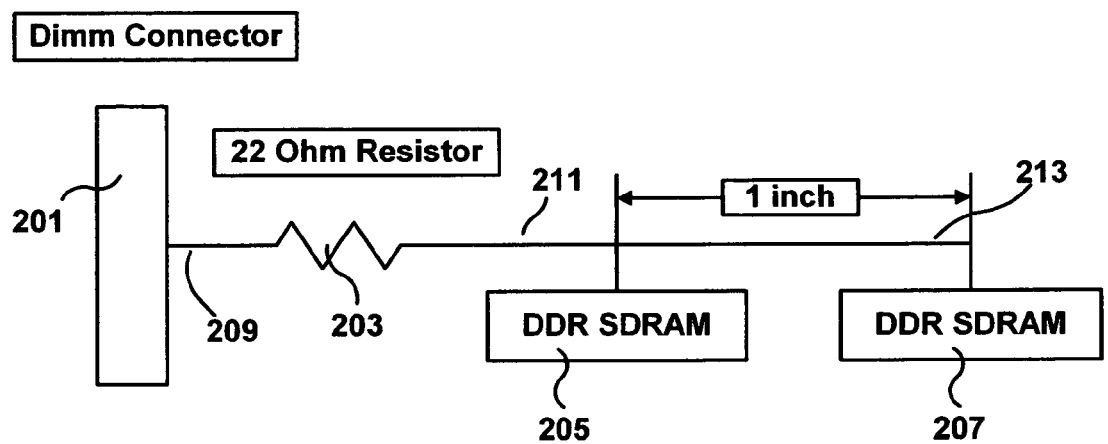
FIG. 2 is a block diagram of a double-high DDR SDRAM DIMM circuit topology according to one embodiment of the invention.

FIG. 2 is a block diagram of a double-high DDR SDRAM DIMM circuit topology according to one embodiment of the invention. Exemplary embodiments provide a doubling of memory capacity in an integrated system of components. The double-high DDR SDRAM DIMM circuit of the present invention meets industry requirements concerning on-board termination in the memory subsystem. The double-high DIMM provides desired memory density and density flexibility while adhering to the circuit board's area constraints. Moreover, this is accomplished without involving DRAM stacking. FIG. 2 shows DIMM connector 201, resistor 203, DDR SDRAM 205 and DDR SDRAM 207, transmission line 1 209, transmission line 2 211, and DIMM transmission line 3 213. It should be appreciated that although the invention described below is discussed in the context of DRAM type memories, the invention may be applicable to other memory types as well.

Transmission line 1 209 couples DIMM connector 201 to a resistor 203 and transmission line 2 211 couples resistor 203 to DDR SDRAM 205. Transmission line 3 213 couples DDR SDRAM 205 to DDR SDRAM 207. According to one embodiment, transmission line 3 is equal to one inch. According to another embodiment transmission line 3 is equal to the smallest distance attainable between DDR SDRAM 205 and DDR SDRAM 207.

DIMM connector 201 receives data input and outputs and supplies the data to internal or external circuit elements. Resistor 203 transmits data that is received at the DRAMs when data is to be stored and transmits data to DIMM connector 201 when data is accessed from the DRAMs.

It should be appreciated that the double-high memory module shown in FIG. 2 is compatible with a termination scheme for a single-high memory module. The transmission properties of the FIG. 2 module allow it to be used in the same system that uses a single-high memory module.

Figure 3:
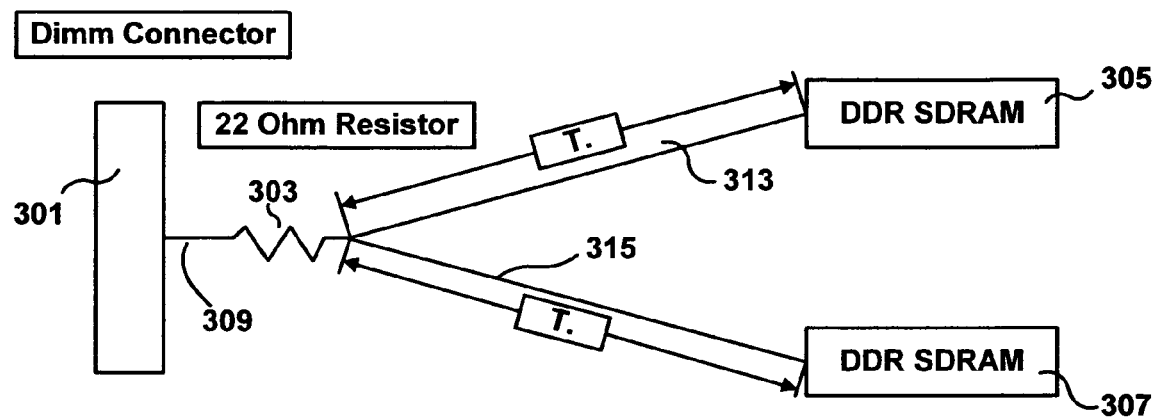
FIG. 3 shows a block diagram of a DIMM topology for a double-high DIMM according to another embodiment of the present invention.

FIG. 3 shows a block diagram of a DIMM topology for a double-high DIMM according to another embodiment of the present invention. In the FIG. 3 embodiment, transmission lines of a specified length supply each DRAM. The transmission lines form a balanced architecture that ensures balanced signals reach the DRAMs. FIG. 3 shows DIMM connector 301, resistor 303, DDR SDRAM 305 and DDR SDRAM 307, transmission line 1 309, DIMM transmission line 313, and DIMM transmission line 315.

Referring to FIG. 3, DIMM connector 301 is coupled to resistor 303 through transmission line 1 309. Moreover, resistor 303 is coupled to DDR SDRAM 305 through DIMM transmission line 313 and to DDR SDRAM 307 through DIMM transmission line 315. DIMM transmission lines 313 and 315 form a balanced architecture that ensures balanced signals reach the DRAMs (e.g., DDR SDRAM 305 and DDR SDRAM 307). As with the FIG. 2 embodiment, this architecture provides desired memory density and density flexibility while adhering to the circuit board's area constraints. Moreover, this is accomplished without involving DRAM stacking thus allowing optimal board space utilization.

It should be appreciated that the double-high memory module shown in FIG. 3 is compatible with a termination scheme for a single-high memory module. The transmission properties of the FIG. 3 module allow it to be used in the same system that uses a single-high memory module.

Figure 4A:
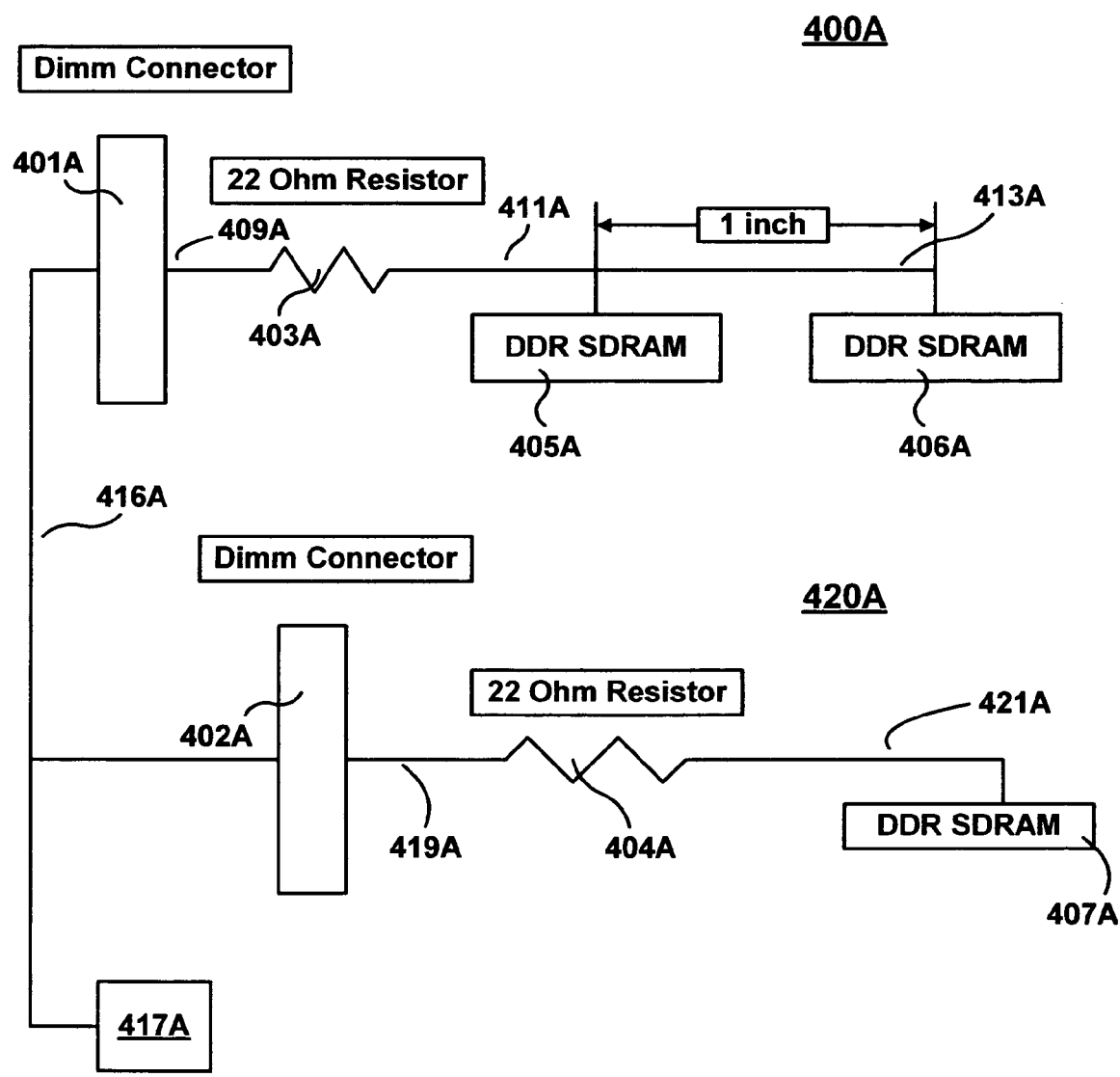
FIG. 4A shows a block diagram of a DIMM topology for a double-high DIMM including a bus controller according to one embodiment of the present invention.

FIG. 4A shows a block diagram of a DIMM topology for a double-high DIMM including a bus controller according to one embodiment of the present invention. FIG. 4A shows DIMM1 connector 401 A, DIMM2 connector 402A, resistor 403A, resistor 404A, DDR SDRAM 405A, DDR SDRAM 406A and DDR SDRAM 407A, DIMM1 transmission line 1 409A, DIMM1 transmission line 2 411A, and DIMM1 transmission line 3 413A, bus 416A, bus controller 417A, DIMM2 transmission line 1 419A and DIMM2 transmission line 2 421 A.

Referring to FIG. 4A, bus controller 417A is coupled to memory module connectors through bus 416A. A single-high memory module 420A is coupled to DIMM2 connector 402A. A double-high memory module 400A is coupled to DIMM1 connector 401 A. Bus controller 417A controls the input and output of data to memory modules 400A and 420A.

Referring again to FIG. 4A, DIMM1 connector 401 A is coupled to DIMM1 resistor 403A through transmission line 1 409A. Moreover, DIMM1 resistor 403A is coupled to DDR SDRAM 405A through DIMM1 transmission line 2 411A. DDR SDRAM 405A is coupled in series to DDR SDRAM 406A through DIMM1 transmission line 3 413A. As with the FIGS. 2 and 3 embodiments, this architecture provides desired memory density and density flexibility while adhering to the circuit board's area constraints. Moreover, this is accomplished without involving DRAM stacking thus allowing optimal board space utilization.

Referring again to FIG. 4A, DIMM2 transmission line 1 419A couples DIMM2 connector 402A to DIMM2 resistor 404A. DIMM2 transmission line 2 421A couples DIMM2 resistor 404A to DDR SDRAM 407A.

DIMM1 connector 401 A receives data input and outputs and supplies the data to internal or external circuit elements. DIMM1 resistor 403A transmits data that is received at the DRAMs when data is to be stored and transmits data to DIMM1 connector 401 A when data is accessed from the DRAMs.

DIMM2 connector 402A receives data input and outputs and supplies the data to internal or external circuit elements. DIMM2 resistor 404A transmits data that is received at the DRAMs when data is to be stored and transmits data to DIMM2 connector 402A when data is accessed from the DRAMs.

It should be appreciated that the double-high memory module shown in FIG. 4A is compatible with a termination scheme for a single-high memory module. The transmission properties of the FIG. 4A double-high memory module allow it to be used in the same system that uses a single-high memory module.

Figure 4B:
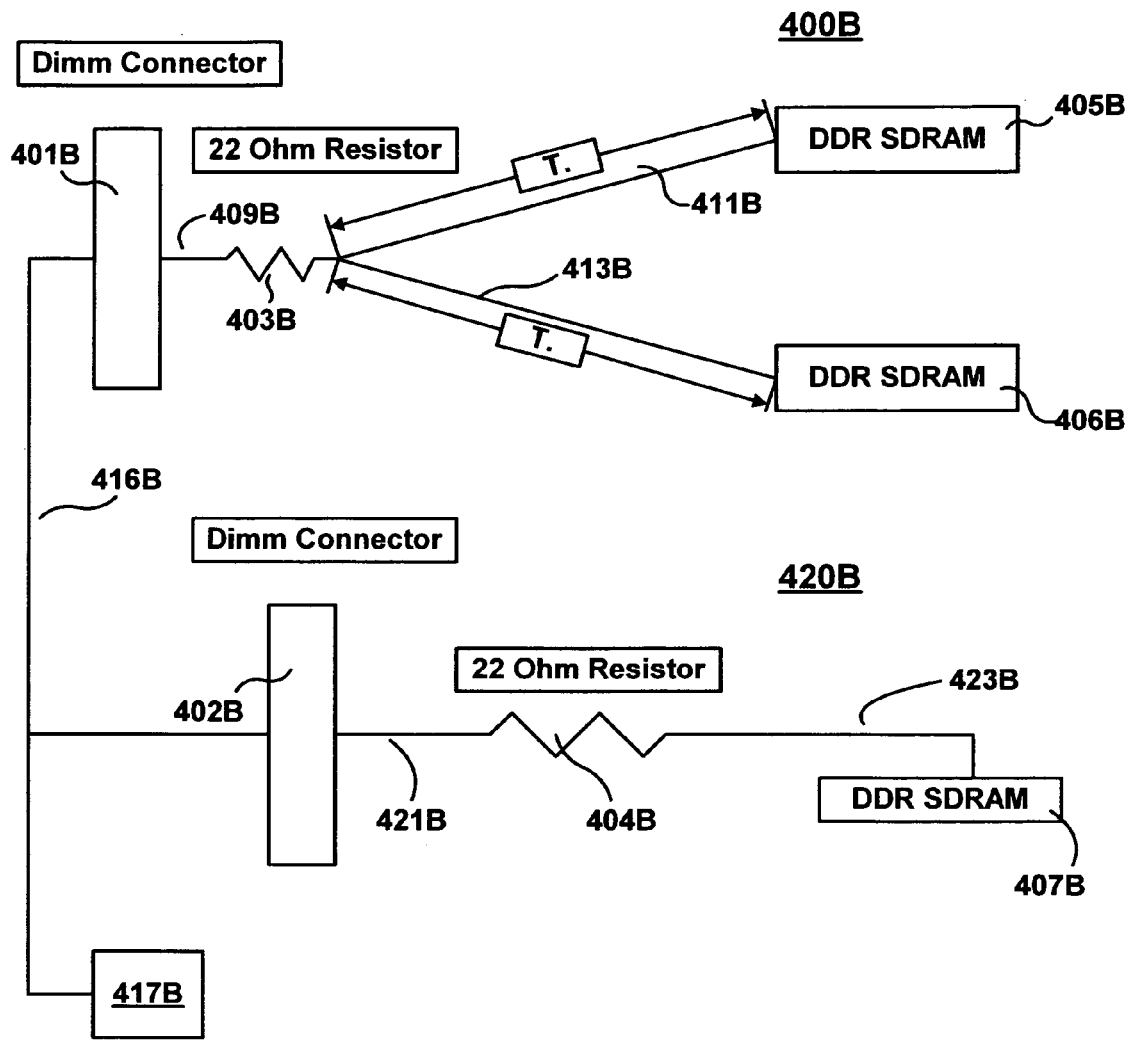
FIG. 4B shows a block diagram of a DIMM topology for a double-high DIMM including a bus controller according to another embodiment of the present invention.

FIG. 4B shows a block diagram of a DIMM topology for a double-high DIMM including a bus controller according to another embodiment of the present invention. FIG. 4B shows DIMM1 connector 401 B, DIMM2 connector 402B, resistor 403B, resistor 404B, DDR SDRAM 405B, DDR SDRAM 406B and DDR SDRAM 407B, DIMM1 transmission line 1 409B, DIMM1 transmission line 2 411B, and DIMM1 transmission line 3 413B, bus 416B, bus controller 417B, DIMM2 transmission line 1 421 B, and DIMM2 transmission line 2 423B.

Referring to FIG. 4B, bus controller 417B is coupled to memory module connectors through bus 416B. Single-high memory module 420B is coupled to DIMM2 connector 402B. Double-high memory module 400B is coupled to DIMM1 connector 401 B. Bus controller 417B controls the input and output of data to memory modules 400B and 420B.

Referring again to FIG. 4B, DIMM1 connector 401B is coupled to DIMM1 resistor 403B through transmission line 1 409B. Moreover, DIMM1 resistor 403B is coupled to DDR SDRAM 405B through transmission line 2 411B and to DDR SDRAM 406B through transmission line 3 413B. As with the FIG. 3 embodiment, transmission lines 411 B and 413B form a balanced architecture that ensures balanced signals reach the DRAMs. Moreover, this architecture provides desired memory density and density flexibility while adhering to the area constraints of conventional circuit boards. Moreover, this is accomplished without involving DRAM stacking thus allowing optimal board space utilization.

Referring again to FIG. 4B, DIMM2 transmission line 1 421 B couples DIMM2 connector 402B to DIMM2 resistor 404B. DIMM2 transmission line 2 423B couples DIMM2 resistor 404B to DDR SDRAM 407B.

DIMM1 connector 401 B receives data input and outputs and supplies the data to internal or external circuit elements. DIMM1 resistor 403B transmits data that is received at the DRAMs (e.g., 405B and 406B) when data is to be stored and transmits data to DIMM1 connector 401 B when data is accessed from the DRAMs.

DIMM2 connector 402B receives data input and outputs and supplies the data to internal or external circuit elements. DIMM2 resistor 404B transmits data that is received at the DRAMs when data is to be stored and transmits data to DIMM2 connector 402B when data is accessed from the DRAMs.

It should be appreciated that the double-high memory module shown in FIG. 4B is compatible with a termination scheme for a single-high memory module. The transmission properties of the FIG. 4B double-high memory module allow it to be used in the same system that uses a single-high memory module.

Figure 5:
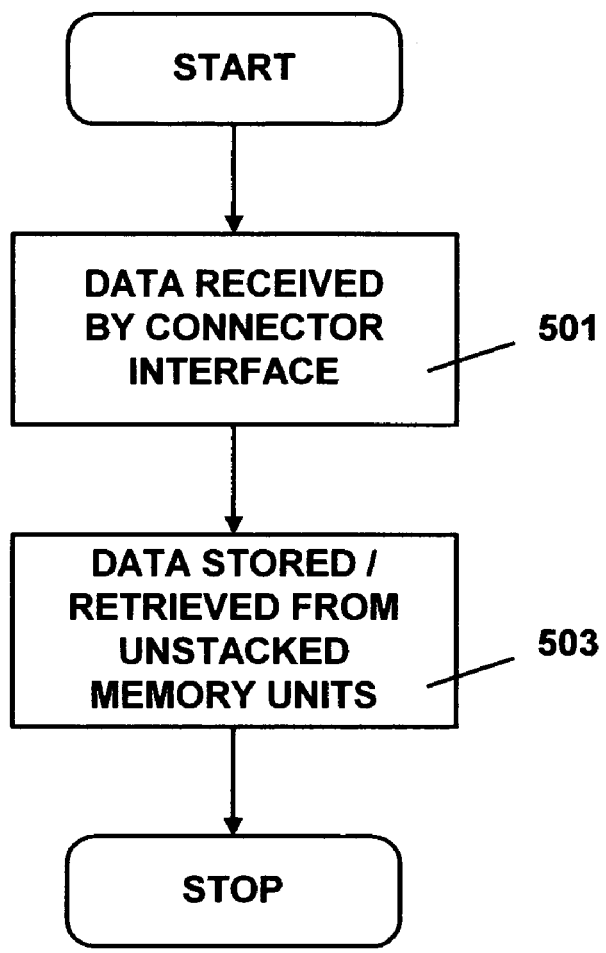
FIG. 5 is a flowchart of the steps performed in a process for storing and retrieving data in a double-high DIMM system according to one embodiment of the present invention.

FIG. 5 is a flowchart of the steps performed in a process for storing and receiving data in a double-high DIMM system according to one embodiment of the present invention.

At step 501, the system is receiving/transmitting data input/output signals. As described herein, according to one embodiment a DIMM connector receives data inputs and outputs and supplies the data to internal or external circuit elements of the DIMM.

At step 503, the system is storing/retrieving data from a plurality of memory units (e.g., DRAMs etc.). According to one embodiment, a DIMM resistor transmits data that is received at the memory units when data is to be stored and transmits data to a DIMM connector when data is accessed from the memory units. According to exemplary embodiments the data is stored/retrieved from a plurality of memory units organized in a non-stacked arrangement (e.g., memory units are not stacked so as to allow optimal board space utilization).

It should be appreciated that the double-high memory module whose operation corresponds to the flowchart of in FIG. 5 is compatible with a termination scheme for a single-high memory module. The transmission properties of the FIG. 5 module allow it to be used in the same system that uses a single-high memory module.

In summary, embodiments of the present invention provide a double-high memory system compatible with termination schemes for single-high memory systems. The system includes an interface for input and output of data. A plurality of memory units is configured in two rows. A transmission line couples the plurality of memory units and the interface. The double-high memory module is provided in a non-stacked arrangement.

The foregoing descriptions of specific embodiments of the present invention have been presented for purposes of illustration and description. They are not intended to be exhaustive or to limit the invention to the precise forms disclosed, and it is evident many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A double-high memory system compatible with termination schemes for single-high memory systems comprising:
an interface for input and output of data;
a plurality of memory units configured in two rows; and
a transmission line coupling said plurality of memory units to said interface, wherein a double-high memory module is provided in a non-stacked arrangement, and wherein said plurality of memory units is coupled together in a daisy chain configuration.

2. The double-high memory module of claim 1, wherein an impedance is situated between said connector and said two memory units.

3. The double-high memory module of claim 2, wherein said impedance is a resistor.

4. The double-high memory module of claim 2, wherein said impedance is a 22 ohm resistor.

5. The double-high memory system of claim 1, wherein said memory modules are dual inline memory modules.

6. The double-high memory module of claim 1, wherein said memory units are DDR SDRAM.

7. The double-high memory module of claim 1, wherein said third transmission line is one inch in length.

8. A system comprising:
a bus controller;
a plurality of memory module connectors coupled to said bus controller;
a single-high memory module coupled to a first of said connectors;
a double-high memory module coupled to a second of said connectors;
said double-high memory module comprising:
an interface for input and output of data;
a plurality of memory units configured in two rows; and
a transmission line coupling said plurality of memory units to said interface,
wherein a double-high memory module is provided in a non-stacked arrangement.

9. The double-high memory module of claim 8, further comprising a second transmission line connected to the first of two memory units that are coupled together via a third transmission line in a daisy chain configuration.

10. The double-high memory module of claim 8, further comprising two separate equal length transmission lines, wherein each of said equal length transmission lines connects to one of two memory units.

11. The double-high memory module of claim 8, wherein an impedance is situated between said connector and said two memory units.

12. The double-high memory module of claim 10, wherein said two separate transmission lines are symmetrically configured and signal transmission is balanced on each of said transmission lines.

13. The double-high memory module of claim 10, wherein each of two substantially equal length transmission lines connects to one of two memory units.

14. The double-high memory module of claim 11, wherein said impedance is a resistor.

15. The double-high memory module of claim 11, wherein said impedance is a 22 ohm resistor.

16. The double-high memory module of claim 8, wherein said memory module is a dual inline memory module.

17. The double-high memory module of claim 8, wherein said memory units are DDR SDRAM.

18. The double-high memory module of claim 9, wherein said transmission line is one inch in length.

19. A method for operating a double-high memory system compatible with termination schemes for single-high memory systems comprising:
receiving data into an interface for input and output of data; and storing and retrieving data from a plurality of memory units configured in two rows, wherein a transmission line couples said plurality of memory units to said interface, wherein said double-high memory module is provided in a non-stacked arrangement, and wherein said plurality of memory units is coupled together in a daisy chain configuration.

20. The method claim 19, wherein an impedance is situated between said interface and said two memory units.

21. The method of claim 20, wherein said impedance is a resistor.

22. The method of claim 20, wherein said impedance is a 22 ohm resistor.

23. The method of claim 20, wherein said memory module is a dual inline memory module.

24. The method of claim 19, wherein said memory units are DDR SDRAM.

25. The method of claim 19, wherein said transmission line is one inch in length.

* * * * *

UNITED STATES PATENT AND TRADEMARK OFFICE
CERTIFICATE OF CORRECTION

PATENT NO. : 7,054,179 B2 Page 1 of 1
APPLICATION NO. : 10/698709
DATED : May 30, 2006
INVENTOR(S) : Mike Cogdill et al.

It is certified that error appears in the above-identified patent and that said Letters Patent is hereby corrected as shown below:

IN THE CLAIMS

Claim 23, Column 8, line 3, delete "claim 20" and insert therefor --claim 19, --

Signed and Sealed this

Sixteenth Day of October, 2007

JON W. DUDAS
*Director of the United States Patent and Trademark Office*